US006396277B1

(12) United States Patent
Fong et al.

(10) Patent No.: US 6,396,277 B1
(45) Date of Patent: May 28, 2002

(54) COIL ON PLUG SIGNAL DETECTION

(75) Inventors: Chee K. Fong; Robert R. Bryant, both of San Jose; James M. Normile, Hayward; Kenneth A. McQueeney, Los Gatos; Timothy J. Spencer, Fremont, all of CA (US)

(73) Assignee: Snap-On Technologies, Inc., Lincolnshire, IL (US)

( * ) Notice: Subject to any disclaimer, the term of this patent is extended or adjusted under 35 U.S.C. 154(b) by 0 days.

(21) Appl. No.: 09/411,182

(22) Filed: Oct. 1, 1999

(51) Int. Cl.[7] .......................... F02P 17/00; G01R 27/26

(52) U.S. Cl. ...................... 324/402; 324/388; 324/393; 324/686; 324/688

(58) Field of Search ................................ 324/388, 389, 324/393, 394, 399, 402, 385, 380, 381, 378, 686, 688; 123/634, 635, 636; 361/311

(56) References Cited

U.S. PATENT DOCUMENTS 3,502,884 A * 3/1970 Perlman et al. .......... 250/214.1
3,798,541 A 3/1974 Campbell, Jr. et al.
3,959,725 A 5/1976 Capek ...................... 324/16 S
4,490,677 A 12/1984 Risner
5,004,984 A * 4/1991 Becker et al. ............. 324/402
5,106,293 A 4/1992 Hawkins
5,111,790 A * 5/1992 Grandy .................. 123/406.14
5,208,541 A 5/1993 Yerkovich et al.
5,376,886 A 12/1994 Shimasaki et al.
5,391,100 A 2/1995 Maruyama et al.
5,419,300 A * 5/1995 Maruyama et al. ......... 123/634
5,933,317 A * 8/1999 Moncrieff .................. 361/311

OTHER PUBLICATIONS

EPO Search Report dated Mar. 1, 2001.

* cited by examiner

*Primary Examiner*—N. Le
*Assistant Examiner*—Anjan K Deb
(74) *Attorney, Agent, or Firm*—McDermott, Will & Emery

(57) ABSTRACT

An apparatus for measuring ignition charge signals produced by coils of coil-on-plug devices of an internal combustion engine. A signal detector comprises an insulating substrate having a first conductive planar layer on a first side and a second conductive planar layer on a second side. The first layer is coupled to a signal wire and the second layer is coupled to a ground wire. When the signal detector is held in close proximity to the coil of the coil-on-plug, ignition signals generated by the coil and passing to the plug are detected. The detected signals may be coupled to a signal analyzer for display and analysis. The amplitude of the signal that is output by the signal detector may be adjusted to different coils having different output signal strengths by modifying the ratio of the surface areas of the first layer and the second layer.

32 Claims, 10 Drawing Sheets

COIL ON PLUG SIGNAL DETECTION

FIELD OF THE INVENTION

The invention relates generally to test equipment useful in diagnosing internal combustion engines. The invention relates more specifically to a signal detector apparatus that can detect coil ignition signals from a coil-on-plug device.

DESCRIPTION OF RELATED ART

Internal combustion engines of the type commonly used in motor vehicles operate by igniting combustible gases in one or more cylinders using assistance from an ignition coil. The ignition coil has two windings: a low-voltage primary winding, and a high-voltage secondary winding. The windings cooperate to transform 12 volts D.C. from the battery into high voltage of 4,000 volts or more that is used by the spark plugs to ignite the air-fuel mixture inside the cylinders.

In a multi-cylinder engine, a distributor is used to couple ignition coil voltage to a plurality of spark plugs. The ignition coil output voltage is coupled to the center of the distributor. The distributor sends spark voltage to each spark plug at the proper time in synchronization with the cylinder combustion cycle.

Newer electronic ignition systems eliminate the distributor but have multiple coils. Each coil fires one or two cylinders at the same time. For example, a V-6 engine could use three ignition coils. In such a "waste spark-type" ignition system, half the time, a spark is sent to a cylinder on an exhaust stroke when the spark is not needed. Nevertheless, waste spark design is an improvement over the distributor-type ignition system because it provides more accurate ignition timing. This higher accuracy results in more horsepower and lower exhaust emissions. A disadvantage of waste spark design is that an engine control computer cannot make cylinder-to-cylinder variations in the ignition timing. Rather, it has to change timing for two cylinders at a time.

In response to this issue, manufacturers have begun using "coil-on-plug" ignition. For example, the 5.7-liter LS1 V8 engine of General Motors features a multiple coil ignition system having one coil per cylinder. Eight coil and driver module assemblies, fired sequentially, are mounted on the valve covers. Short secondary wires carry the voltage to the spark plugs just below the coil/driver module assemblies. Some manufacturers call this design "coil-near-plug," "coil-by-plug," or "distributorless electronic ignition."

Coil-on-plug ignition has numerous advantages. The system puts out very high ignition energy for plug firing. Because there are no wires or other connections from the coil to the plug, little or no energy is lost to connection resistance. Also, since firing is sequential, as opposed to waste spark, no energy is lost to the waste spark gap. It allows the vehicle computer to vary ignition timing for each cylinder, which improves power and reduces emissions. It provides simplified wiring and simplified diagnosis of problems.

Coil-on-plug ignition also enables compliance with current U.S. Government onboard diagnostic (OBD-II) regulations. These federal regulations specify that a vehicle computer must monitor for possible cylinder misfires that could be caused by a fault in the ignition or fuel-injection systems. Using coil-on-plug ignition, the computer can monitor the voltages produced in the secondary windings of the coil. Through computer analysis of these voltage signals, the computer can detect when a particular cylinder has misfired.

Also, a technician can determine which particular cylinder is at fault with the help of a diagnostic apparatus tool. Signal detectors ("test probes") are widely used in diagnosing and repairing defects in motor vehicles having internal combustion engines. A signal detector may be attached to an appropriate test point on a motor vehicle engine or other part under test. The signal detector detects an electrical or electronic signal at the test point and communicates the signal as input to a motor vehicle diagnostic apparatus, which generates and displays a waveform of the signal. Examples of suitable electronic digital signal analyzers or scanning tools include the Vantage® handheld diagnostic device, which is commercially available from Snap-On Diagnostics, San Jose, Calif.

FIG. 5A is a diagram of an ignition waveform 550 of the type generated by such signal analyzers, showing signal characteristics that are of interest in engine diagnosis, maintenance and repair. Generally, waveform is plotted on axes representing voltage (vertical axis) and time (horizontal axis). The characteristics that are primarily of interest are firing voltage, burn time, and burn voltage. Waveform 550 includes a firing voltage feature 552, burn time feature 554, and burn voltage feature 556. These features may be analyzed to determine whether an ignition coil or spark plug are operating correctly.

The Vantage® handheld electronic diagnostic device, with an additional electronic module that is commercially available from its manufacturer, can accept several different probes. In operation, a technician selects a desired test. A commonly conducted test identifies characteristics of the firing voltage and firing time of the ignition system. In this test, a detector end of a test probe is attached to the coil of the engine. Attachment may be direct, by conductive attachment to an electric signal point of the component under test, or indirect. The other end of the test probe is plugged into the diagnostic apparatus. The test probe communicates an electronic signal, representative of characteristics of the component under test, to the diagnostic apparatus. The diagnostic apparatus receives the signal, analyzes it, and displays a graph of the signal or recommendations for service.

However, conventional test probes are not adaptable to coil-on-plugs. There is no accurate, simple way to detect or obtain an ignition signal from a coil-on-plug device. One current approach for conventional engines involves attaching a diagnostic probe to the distributor coil, as exemplified by U.S. Pat. No. 3,959,725 (Capek, 1976). In the Capek approach, a single conductive probe is attached to the secondary coil of a distributor and wired to a positive signal input of an oscilloscope. A circuit is completed by coupling the negative signal input of the scope to chassis ground of the engine. In this approach, though, noise is a significant problem.

Further, there is no way to adjust the level of the signal input to account for differences in voltage output and other parameters of different coils and distributors. The Capek probe is prone to overloading or saturating the input circuitry of the oscilloscope or other test device. This causes the device to display inaccurate signal waveforms and can damage the device. Some oscilloscopes can be used to address this problem by adjusting gain controls that attenuate the input. However, modern handheld signal analyzers normally do not have such gain controls and require input signals to have an amplitude within a predictable narrow range.

Accordingly, there is a need in this field for an ignition signal detector or test probe that operates with coil on plug devices.

There is a particular need for a signal detector or test probe that can accommodate different coil on plug assemblies offered by different part manufacturers. Specifically, there is a need for a signal detector that provides a signal level that can be attenuated for different coil on plug assemblies to prevent overload of external test equipment and that provides a signal substantially free of noise.

SUMMARY OF THE INVENTION

The foregoing needs and objects, and other needs and objects that will become apparent from the following description, are fulfilled by the present invention, which comprises, in one aspect, an apparatus for detecting motor vehicle electric ignition signals from a coil on plug, comprising a first conductive planar layer and a second conductive planar layer separated by and affixed to a non-conductive substrate and adapted for mounting in close proximity to a coil of the coil on plug. In one feature of this aspect, the apparatus further comprises means for holding the substrate in proximity to the coil of the coil on plug and separated therefrom by a predetermined distance.

Another feature comprises a probe body adapted for interchangeably receiving one of a plurality of substrates, and means on the probe body for holding the probe body in proximity to the coil of the coil on plug and separated therefrom by a predetermined distance.

In one embodiment, the first layer is substantially rectangular, the second layer is substantially rectangular, and the first layer and the second layer have substantially equal surface areas. Alternatively, the first layer and the second layer have substantially different surface areas. In still another alternative, a difference in the surface areas of the first layer and the second layer is directly proportional to strength of the motor vehicle electric ignition signals.

In another aspect, the invention provides a diagnostic apparatus for use in analyzing ignition signals generated by a coil on plug. The apparatus comprises a signal detector comprising a first conductive planar layer and a second conductive planar layer separated by and affixed to an insulating substrate and adapted for mounting in close proximity to a coil of the coil on plug; a signal wire coupled to the first conductive layer and coupled to a signal input of a digital signal analyzer; a ground wire coupled to the second conductive layer and coupled to a ground input of the digital signal analyzer.

According to another aspect, the invention provides a method of measuring electric ignition signals of a coil on plug of an internal combustion engine. The method may involve holding a signal detector, comprising a first conductive planar layer and a second conductive planar layer which are separated by and affixed to an insulating substrate, in close proximity to a coil of the coil on plug; coupling a signal wire from the first layer to a signal input of an electronic digital signal analyzer; coupling a ground wire from the second layer to a ground input of the signal analyzer; and obtaining a measurement of the electric ignition signals using the signal analyzer based on detection of the electric ignition signals by the signal detector.

One feature of this aspect involves adjusting sensitivity of the signal detector by adjusting the relative size of the second layer with respect to the first layer.

In one specific embodiment, a signal detector comprises an insulating substrate having a first conductive layer on a first side and a second conductive layer on a second side. The first layer is coupled to a signal wire and the second layer is coupled to a ground wire. When the signal detector is held in close proximity to the coil of the coil-on-plug, ignition signals generated by the coil and passing to the plug are detected. The detected signals may be coupled to a signal analyzer for display and analysis.

One layer acts as a signal detector and the other layer acts as a ground plane. The ground plane reflects and absorbs a portion of the energy generated by the coil and thereby serves to attenuate the strength of the signal observed at the signal detector layer. The amplitude of the signal that is output by the signal detector may be adjusted to different coils having different output signal strengths by modifying the ratio of the surface areas of the first layer and the second layer. Noise is reduced through use of a differential signal.

BRIEF DESCRIPTION OF THE DRAWINGS

The foregoing and other features, aspects and advantages of the present invention will become more apparent from the following detailed description of the present invention when taken in conjunction with the accompanying drawings, in which like reference numerals indicate like elements and in which.

DETAILED DESCRIPTION OF ILLUSTRATIVE EMBODIMENTS

Figure 1:
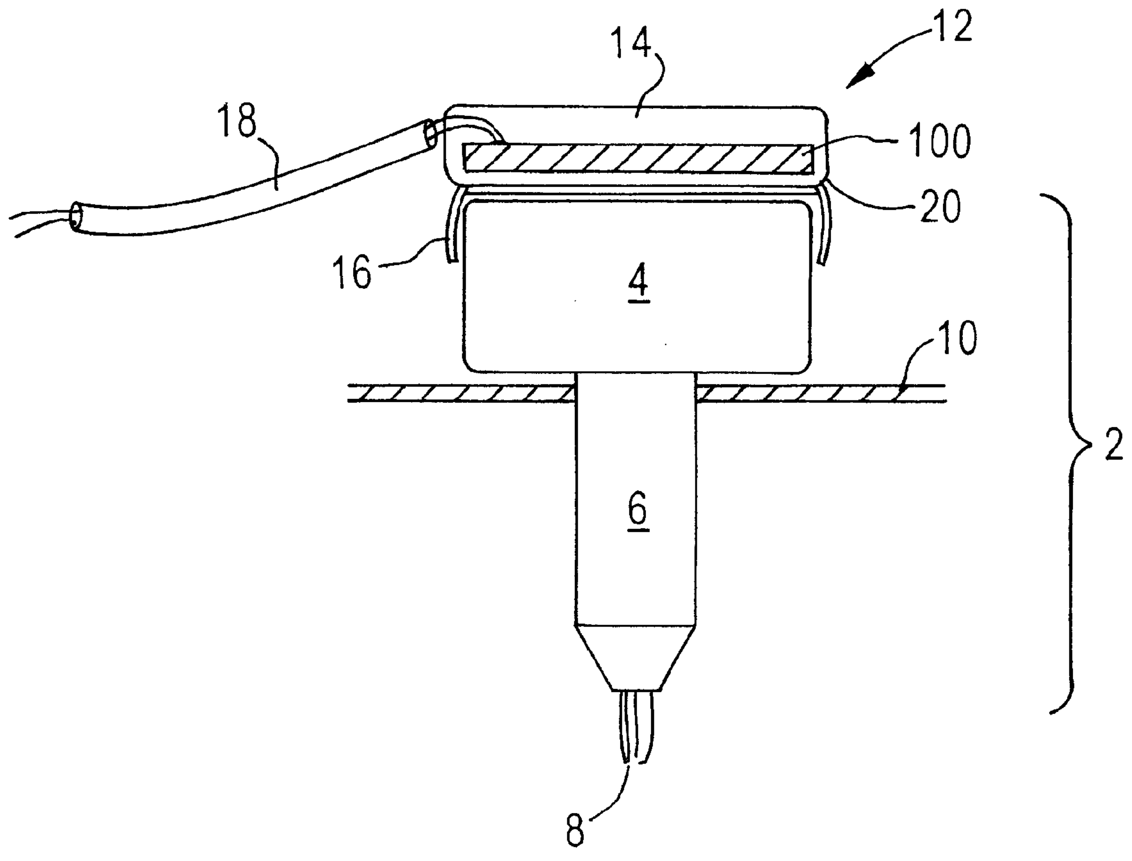
FIG. 1 is a side elevation view of a signal detector according to an embodiment.

FIG. 1 is a side elevation, part section view of a signal detector mounted to a coil on plug.

Coil on plug 2 generally comprises a spark coil 4 integrally mounted on spark plug 6, which protrudes into and is mounted in cylinder 10 and terminates in spark gap 8. Coil 4 conducts transformed, high voltage direct current to spark plug 6 using internal connections. Coil 4 receives low voltage direct current via a wiring harness that has a distal end coupled to a primary coil of coil 4 and a proximal end coupled to a battery. Coil on plug devices that are suitable for use in this context are commercially available from AC Delco.

Signal detector assembly 12 is mounted on coil 4 for measurement of signal characteristics of signals or current generated by a secondary coil of coil 4. Generally, signal detector assembly 12 comprises probe housing 14, sensor 100, mounting clips 16, and cable 18. The probe housing 14 encloses and protects sensor 100 from the exterior environment which, in a motor vehicle engine compartment, can involve extreme conditions. Sensor 100 acts as a passive signal detector for detection of signals and current generated by coil 4. Cable 18 conducts signals detected by sensor 100 to other equipment, such as a digital signal analyzer.

Preferably, probe housing 14 is configured to interchangeably receive one of a plurality of different sensors 100, each of which is adapted for use for a different coil on plug of a particular model or manufacturer. A variety of means for providing such interchangeability may be used. For example, housing 14 may include a plurality of upwardly projecting bosses that snugly engage corresponding holes in sensor 100. Alternatively, screws may pass through holes in sensor 100 and thread into holes in housing 14. Any other removable fastener or detachable mounting means may be used.

Mounting clips 16 are affixed to a bottom wall 20 of housing 14 and are configured to snugly grip coil 4. Clips 16 may be formed of any suitable resilient material of sufficient mechanical strength to grip coil 4 while subject to vibration or other environmental conditions while an engine containing coil 4 is in operation. Suitable materials include spring steel, various low-carbon steels, engineering plastics and other polymers, etc.

Figure 2A:
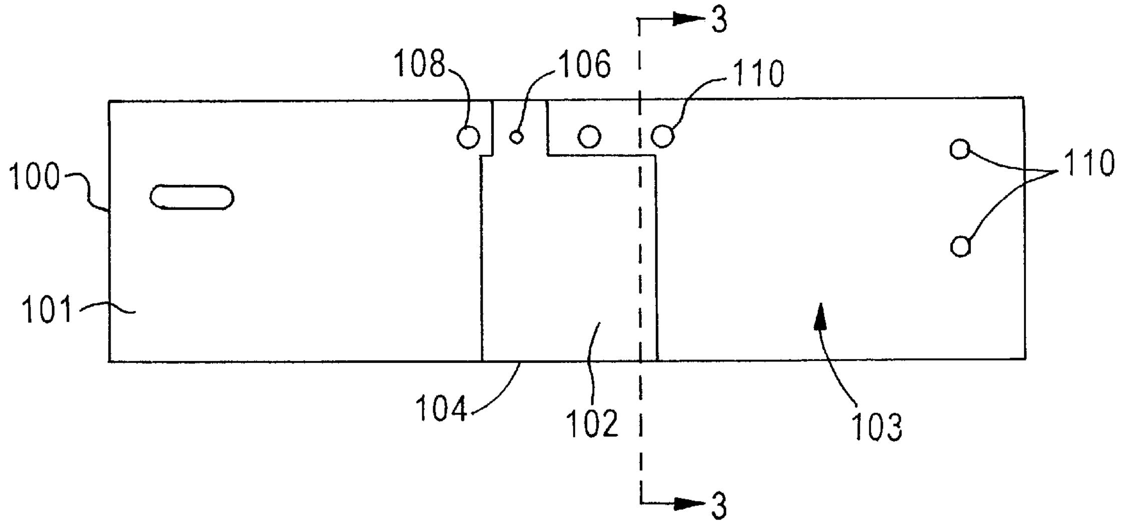
FIG. 2A is a top plan view of a first side of the embodiment of FIG. 1.

FIG. 2A is a top plan view of an exemplary embodiment of sensor 100 configured for use as a coil on plug signal detector. Sensor 100 comprises a substrate 101 that may comprise a substantially rectangular panel of non-conductive material. Glass-epoxy composite, various polymers, ceramics, phenolic, etc., may be used. Substrate 101 is substantially thin and planar and has a first conductive layer 102 on its upper face 103 and a second conductive layer 104 on its lower face 105.

The first conductive layer 102 is adhered or bonded to substrate 101. In one embodiment, layer 102 is a thin sheet of copper foil. An epoxy or polymer sealant may be applied over layer 102 in order to retard or prevent corrosion. Although layer 102 may have any geometric shape, in FIG. 2A layer 102 is shown in substantially rectangular form. In practice, a rectangular form has been found preferable and conveniently matches the profile of a coil and housing of coil on plug 4.

In one embodiment, layer 102 is a rectangular copper foil layer approximately 13 mm×16 mm in dimensions. In another embodiment, layer 102 is a rectangular layer approximately 22 mm×25 mm in dimensions. These dimensions are not critical and are provided merely as examples that are operational with known commercial coil on plug assemblies. Other dimensions and geometries may be used within the scope of the invention.

Figure 2B:
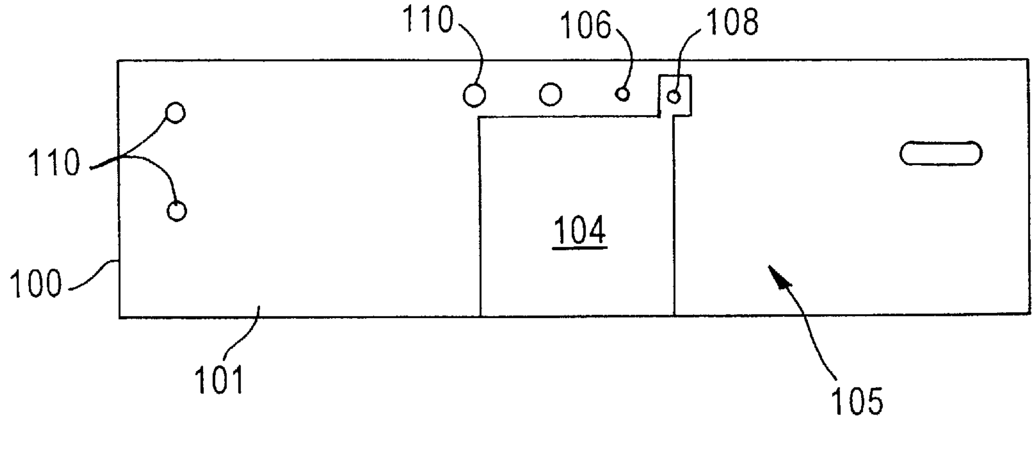
FIG. 2B is a bottom plan view of a second side of the embodiment of FIG. 1.

FIG. 2B is a bottom plan view of bottom face 105 of sensor 100. Bottom face 105 includes a generally planar second conductive layer 104 adhered or otherwise affixed to the bottom face. Layer 104 may be rectangular, as shown in FIG. 2B as an example, or may be formed in any other planar geometric configuration. Layer 104 may comprise copper or any other highly conductive material.

Sensor 100 also comprises first and second holes 106, 108 for securing first and second conductors, respectively, to first and second layers 102, 104. Holes 106, 108 may be plated-through holes in order to facilitate soldering the first and second wires in or through the holes to the first and second layers. In one embodiment, wires in cable 18 of FIG. 1 are conductively coupled (e.g., soldered) to layers 102, 104 using holes 106, 108. In another embodiment, in which sensor 100 is interchangeable with other sensors in housing 14, first and second wires of cable 18 are soldered or crimped to corresponding conductive pins affixed in housing 14. The pins extend generally upward and snugly engage holes 106, 108 when sensor 100 is placed in housing 14. Conductors other than wires may be used.

Figure 3:
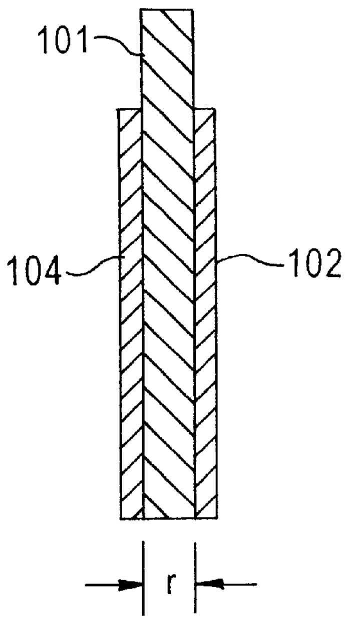
FIG. 3 is a side section view of the embodiment of FIG. 1.

FIG. 3 is a side section view of sensor 100 taken along line 3—3 of FIG. 2A. As seen in FIG. 3, layers 102, 104 are affixed to and thinly separated by substrate 101. In practice, substrate 101 may be approximately 1 mm to 3 mm in thickness. The sensor 100 may be manufactured using printed circuit board techniques.

Generally, the first layer 102 and second layer 104 respectively act as a signal detector and as a ground plane. In an embodiment, first layer 102 is a signal detection layer and second layer 104 is a ground plane. First layer 102 is conductively coupled to an external signal analyzer device, such as Vantage®. The ground plane reflects a portion of the energy generated by the coil and thereby serves to attenuate the strength of the signal observed at the signal detector layer. Further, use of a ground plane at the probe, rather than relying on chassis ground as a ground source for an external signal analyzer or oscilloscope, substantially eliminates noise in the measured signal.

Alternatively, the first and second layers are coupled, respectively, to differential signal inputs of the signal analyzer or oscilloscope. Thus, the first and second layers provide a +signal input and a −signal input, respectively. Advantageously, noise is reduced through use of such a differential signal.

Figure 4:
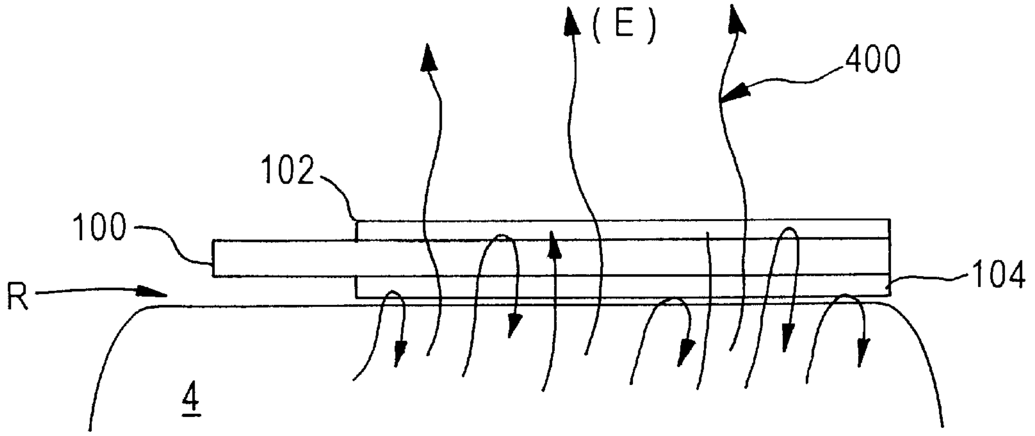
FIG. 4 is a simplified diagram of a signal detector positioned on a coil on plug device of a motor vehicle engine.

FIG. 4 is a simplified diagram of certain elements of FIG. 1 showing the position of sensor 100 to coil 4 during a signal sensing operation.

In this arrangement, sensor 100 lies within a field 400 of electromagnetic radiation that is emitted by coil 4 when the coil is transforming battery voltage into high-voltage for use by a spark plug. Second layer 104, which contacts a housing of the coil 4, is brought substantially to ground potential by virtue of such contact. A positive voltage potential is induced or otherwise developed across layer 102, 104 and may be measured at or received from the surface of layer 102. The voltage observed at layer 102 is proportional to the voltage at the terminal end of the secondary coil of coil 4. A signal taken from layer 102 may be used in diagnosing ignition spark voltage characteristics such as spark voltage, burn time, etc., or diagnosing other problems such as open wires, etc.

In this configuration, firing and burn time characteristics of an ignition system can be measured using the signal observed at layer 102. Further, the range of the potential observed at layer 102, that is, the strength of an output signal from sensor, 100, may be finely controlled by varying the sizes of layer 102, 104. It has been found, for example, that reducing the surface area of the ground plane or second layer 104 increases the amplitude and strength of the signal observed at the first layer 102. Conversely, reducing the surface area of the first layer 102 decreases the signal strength.

Moreover, the relative sizes of the signal detection layer as compared to the ground layer will affect signal strength. For example, a configuration having a signal detection layer that is smaller in surface area than the ground layer may be used in connection with certain high energy ignition (HEI) coils, of the type made by General Motors and others. In this embodiment, layer 102 is a rectangular layer approximately 22 m×25 mm in dimensions, and layer 104 is a rectangular layer approximately 25 mm×25 mm in size. Layer 104 is centered over layer 102.

Experimentally it has been found that a signal detector of the configuration disclosed herein, coupled to a handheld signal analyzer such as the Vantages® device, approximates the signal accuracy and resolution of a high-end measuring device such as a Textronix® oscilloscope. Thus, advantageously, a signal detector of the type disclosed herein offers an automotive mechanic with the same diagnostic capability as a high-end measuring device but in a simpler configuration at much lower cost.

In operation, low voltage and high current are applied to the primary winding of an ignition coil, and accordingly the primary winding generates an electromagnetic field that principally consists of a magnetic field (H). The secondary winding generates an electromagnetic field that is primarily an electric field (E) because it carries high voltage and low current. The need addressed by embodiments disclosed herein is detecting the electric field of the secondary winding.

Figure 5A:
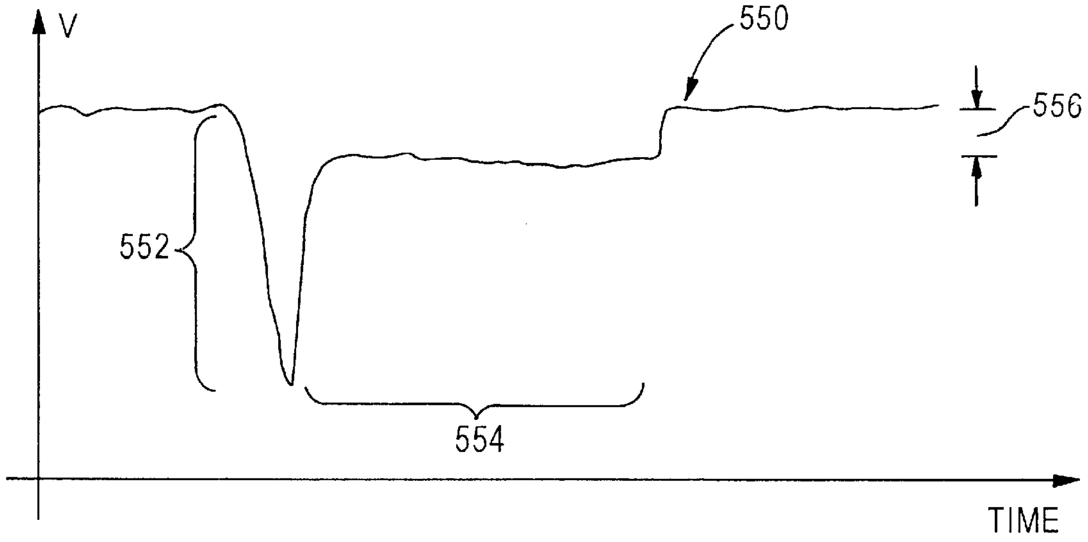
FIG. 5A (PRIOR ART)
FIG. 5A is a waveform diagram showing an ignition signal and its characteristics.
Figure 5B:
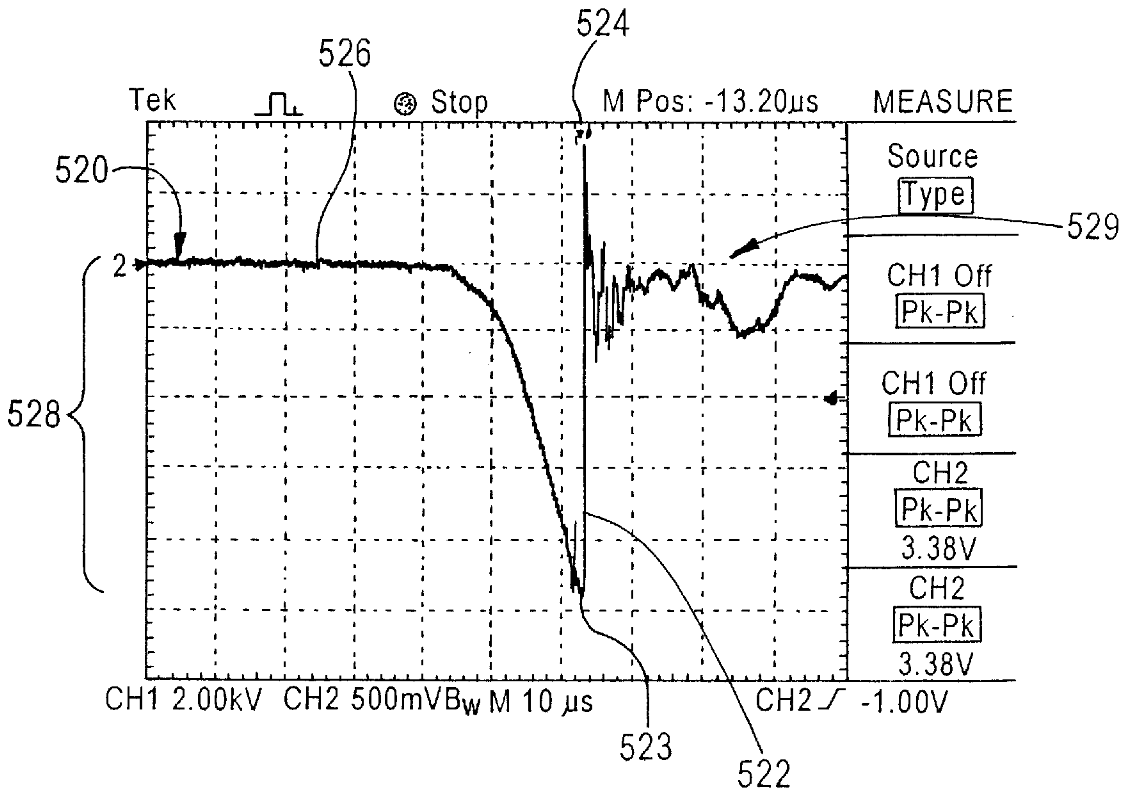
FIG. 5B is a waveform diagram showing an ignition signal of a coil on plug as detected by a signal detector according to an embodiment as disclosed herein, and focusing on a firing voltage feature.

FIG. 5B is a waveform diagram showing an ignition signal of a coil on plug as detected by a signal detector according to an embodiment as disclosed herein, and focusing on a firing voltage feature. Waveform 520 includes a firing feature 522 and a burn time feature 529. Firing feature 522 may be used as the basis for determining firing voltage 528 by comparing the voltage level at horizontal portion 526 with the voltage level at lower peak 523 of firing feature 522. Peak firing voltage is indicated by lower peak 523. Only a portion of the burn time feature 529 is visible in FIG. 5B due to the time scale of FIG. 5B, however, it may be observed readily by displaying the same signal using a different scale, as seen in FIG. 5C.

Figure 5C:
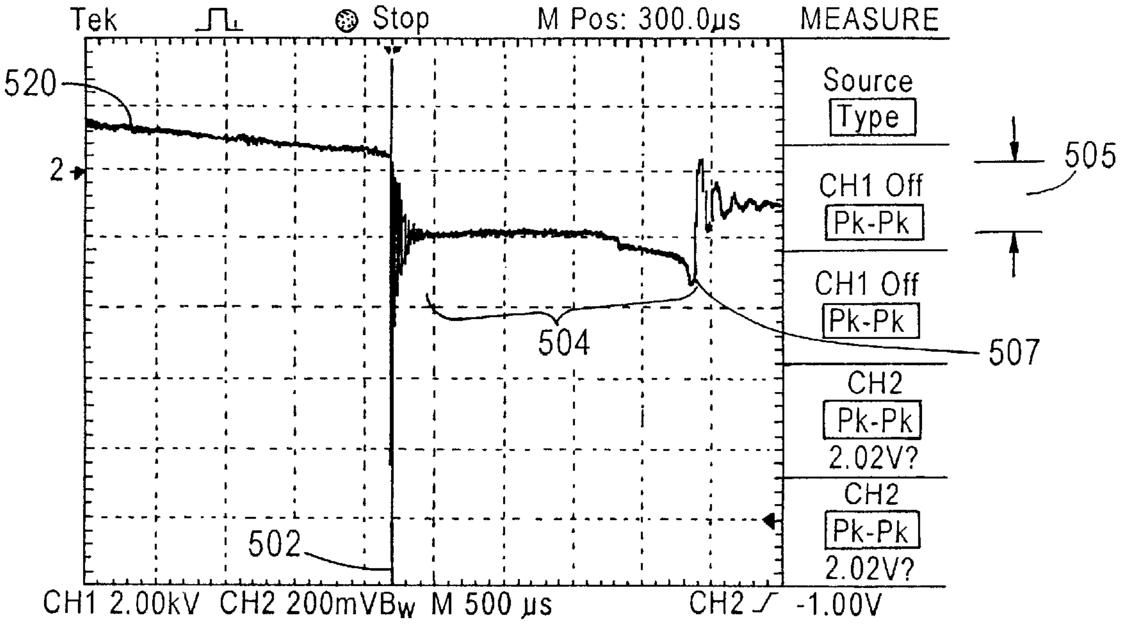
FIG. 5C is a waveform diagram showing an ignition signal of a coil on plug as detected by a signal detector according to an embodiment as disclosed herein, and focusing on a burn time feature.

FIG. 5C is a waveform diagram showing an ignition signal of a coil on plug as detected by a signal detector according to an embodiment as disclosed herein, and focusing on a burn time feature. Waveform 520 includes a firing peak 502 and burn time feature 504. The magnitude of burn voltage 505 may be determined by comparing the average magnitude of burn time feature 504 to the magnitude of burn peak 507.

Figure 5D:
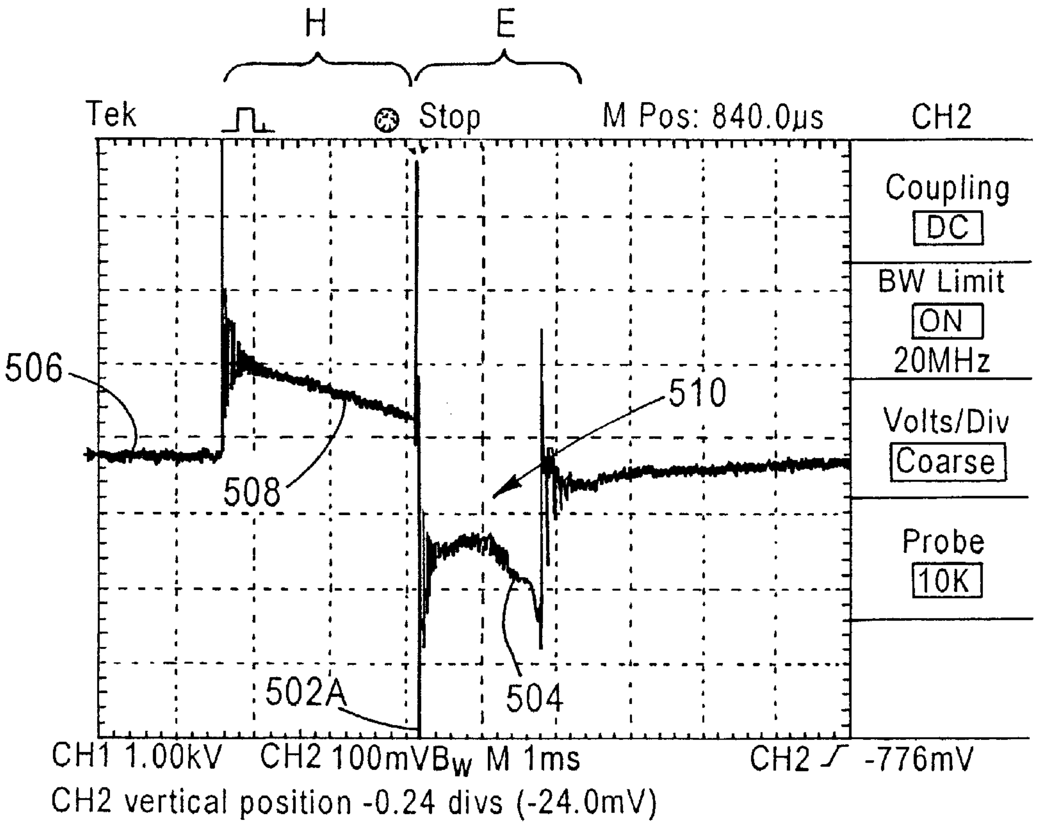
FIG. 5D is a waveform diagram showing an ignition signal as detected by a signal detector according to an embodiment as disclosed herein.

FIG. 5D is a waveform diagram showing an ignition signal as detected by a signal detector according to an embodiment as disclosed herein. The primary features visible in the waveform of FIG. 5C relate to firing voltage. Waveform 506 is generated based upon the signal that is detected. Waveform 506 includes a magnetic feature 508 that generally represents the magnetic portion of the electromagnetic field generated by the coil on plug, and an electric feature 510 that generally represents the electric portion of the field. Electric feature 510 is also associated with the burn time of the coil on plug as shown by burn time feature 504. The true peak firing voltage of the coil on plug is clearly indicated by a peak feature 502A. Further, the burn time feature 504 includes finely detailed burn spark features that aid in understanding operating characteristics of the coil on plug.

The detected signal is a near field signal because the sensor 100 is generally placed less than a distance of $\lambda/2\pi$ from the source, where $\lambda$ is the wavelength of the signal. At a near field position, the intensity of E decreases according to the proportion $1/r^3$, where r is the distance between the sensor 100 and the coil 4.

The second layer 104 serves to reflect and absorb incident radiation of the field E. Accordingly, radiation that passes through the second layer 104 and reaches the first layer 102 is attenuated in strength. The first layer 102 absorbs a portion of the radiation of field E and also reflects a portion of the radiation of field E. As a result, the signal observed at the first layer 102 is further attenuated. Further reflection may also occur within the layers themselves, however, such reflection is typically minimal and may be ignored in determining design characteristics of the layers.

Figure 6:
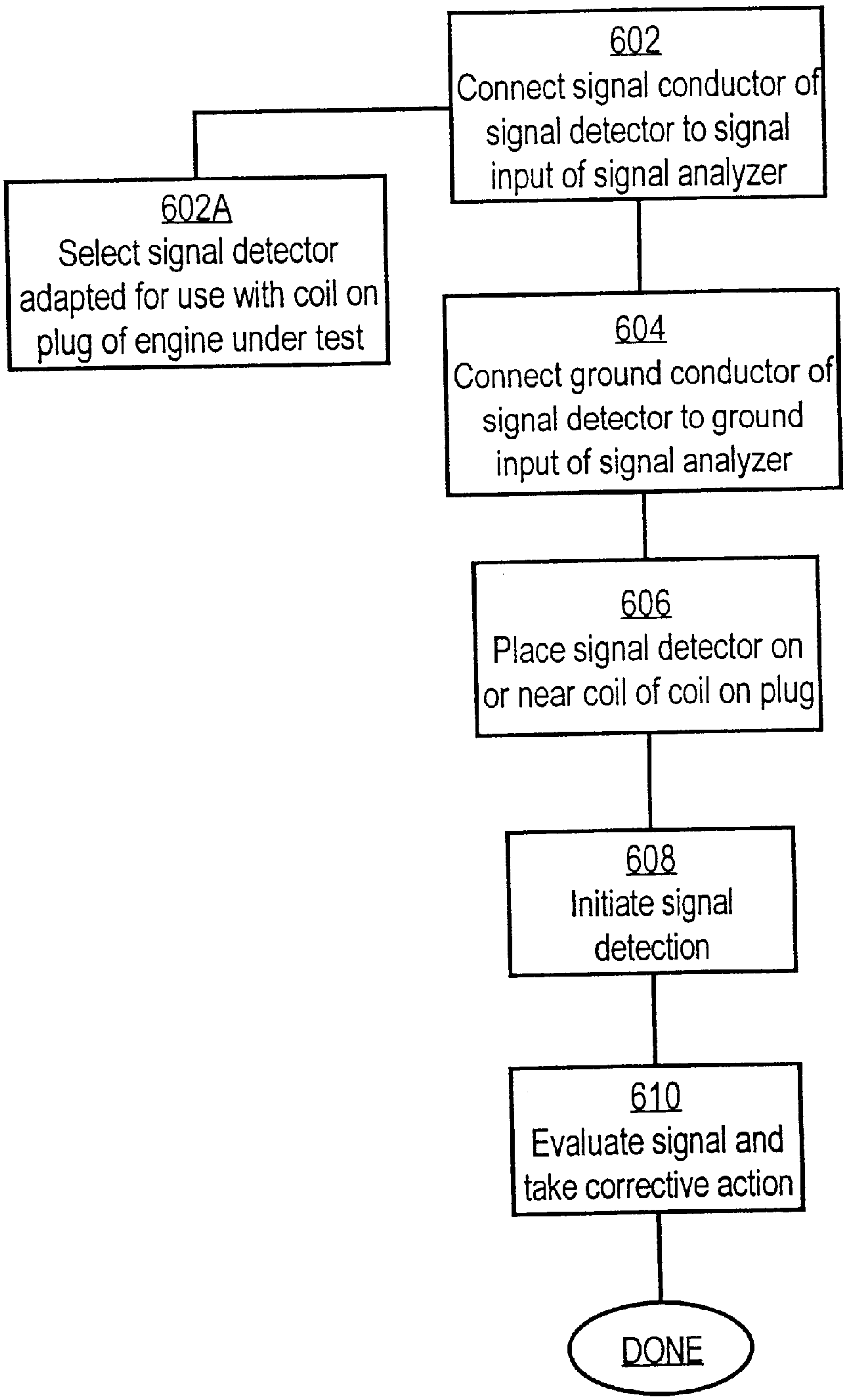
FIG. 6 is a flow diagram of a process of coil on plug signal detection.

FIG. 6 is a flow diagram of a process of coil on plug signal detection.

In block 602, a signal conductor of a signal detector is connected to the signal input of a signal analyzer. The signal analyzer may be a motor vehicle diagnostic device such as a Vantage® apparatus, an oscilloscope, etc. Block 602 may involve selecting a signal detector that is adapted for use with the particular coil on plug of an engine under test, as indicated by block 602A. The signal detector may have the configuration shown in FIG. 1, FIG. 2A, FIG. 2B, FIG. 3, and FIG. 4. In block 604, a ground conductor of the signal detector is connected to the ground input of the signal analyzer. As an alternative to block 602 and block 604, differential signal inputs from the signal detector may be applied to the signal analyzer.

In block 606, the signal detector is placed on or near the coil of the coil on plug device. Block 606 may involve attaching the signal detector to the coil on plug. Alternatively, block 606 may involve holding the signal detector in close proximity to a coil of the coil on plug.

In block 608, signal detection is initiated. Block 608 may involve obtaining a measurement of the electric ignition signals using the signal analyzer based on detection of the electric ignition signals by the signal detector. In block 610, the signal is evaluated and corrective action is taken, if necessary. Block 610 may involve observing signal characteristics using a waveform display of the signal analyzer and determining whether corrective action is needed.

Figure 7A:
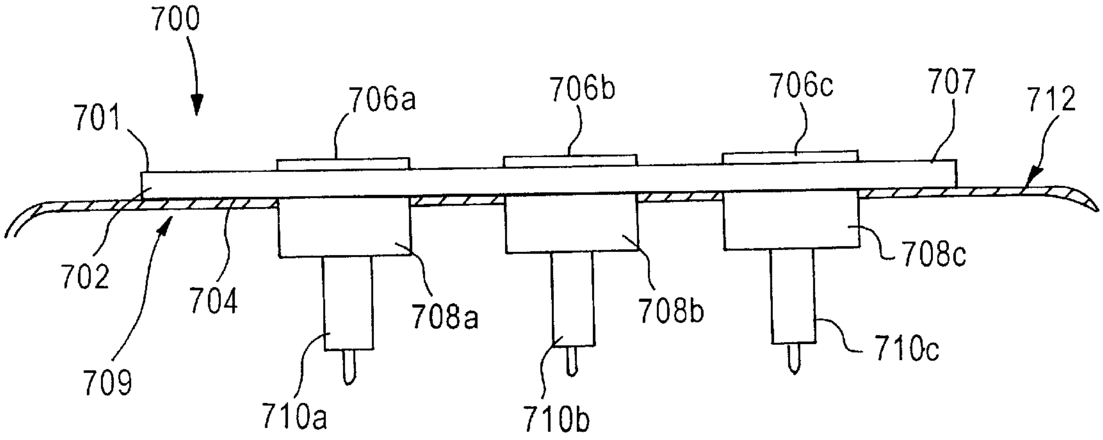
FIG. 7A is a side elevation view of an alternate embodiment of a signal detector.

FIG. 7A is a side elevation view of an alternate embodiment of a signal detector. In the embodiment of FIG. 7A, a plurality of signal detectors are ganged together to enable detection of signals from a plurality of cylinders of a multi-cylinder engine. Signal detector 700 comprises a generally elongated, flat strut 701 comprising an insulating layer 702 and a ground plane or ground layer 704. A plurality of signal detection layers 706*a*, 706*b*, 706*c* are affixed to an upper face 707 of strut 701. Each of the signal detection layers 706*a*, 706*b*, 706*c* is aligned over a corresponding coil 708*a*, 708*b*, 708*c* and spark plug 710*a*, 710*b*, 710*c* of a multi-cylinder engine 712.

In the embodiment of FIG. 7A, three coils and three plugs are shown schematically as an example. The embodiment depicts a signal detector that may be used to test ignition signals in a three-cylinder engine or three of six cylinders in a V-6 motor vehicle engine. Any number of signal detection layers 706*a*–706*c* may be provided according to the cylinder arrangement of the engine under test.

Figure 7B:
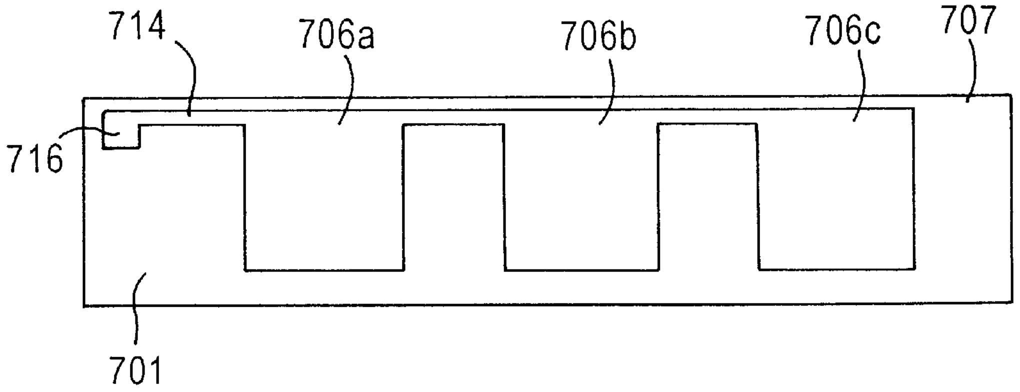
FIG. 7B is a top plan view of the embodiment of FIG. 7A.

FIG. 7B is a top plan view of the embodiment of FIG. 7A. As seen in FIG. 7B, strut 701 comprises a generally rectangular, planar sheet of insulating material. Affixed on upper face 707 are signal detector layers 706*a*, 706*b*, 706*c*. Signal detector layers are conductively coupled by a conduction path 714, which terminates in a signal connection point 716. In one embodiment, signal detector layers 706*a*, 706*b*, 706*c* are formed from conductive material such as copper foil using printed circuit board techniques. The layers and the conduction path may be etched in continuously connected manner. A signal transmission wire or test probe wire may be conductively coupled to connection point 716 and routed to a signal analyzer or oscilloscope.

Alternatively, signal detector layers 706*a*, 706*b*, 706*c* are formed as discrete conductive regions and are not conductively coupled together. Separate signal connection points may be provided at each layer. This embodiment enables multiple signals to be viewed concurrently. However, the layers may be coupled together and routed to a single input of a signal analysis device because in a conventional internal combustion engine, cylinders fire at different times. Moreover, when the layers are coupled together and a single input is used from a single connection point 716, the incoming signal can be synchronized to the engine's firing sequence. With such synchronization, a signal analyzer that receives the signal, or a technician, can determine a specific coil on plug that is malfunctioning in a multi-cylinder engine.

Figure 7C:
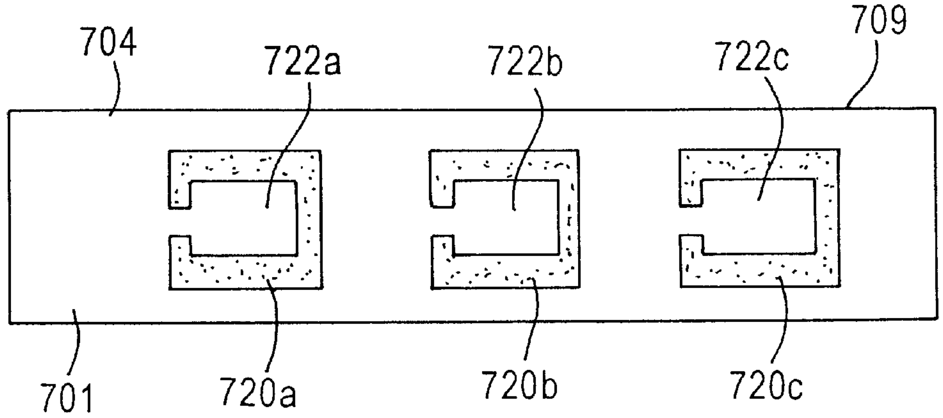
FIG. 7C is a bottom plan view of the embodiment of FIG. 7A.

FIG. 7C is a bottom plan view of the embodiment of FIG. 7A. Bottom face 709 of strut 701 comprises a generally planar conductive layer 704 that is affixed to the bottom face 709 and covers a large portion of the face. Conductive layer 704 serves as a ground plane of the signal detector apparatus. A plurality of open regions 720*a*, 720*b*, 720*c* are disposed in layer 704 and are located in vertical alignment with coils 708*a*, 708*b*, 708*c*, respectively, when strut 701 is mounted over the coils. The open regions 720*a*–720*c* consist of non-conductive material. Layer 704 may be formed from copper foil, as in a printed circuit board, and open regions 720*a*–720*c* may be formed by selectively etching layer 704 to expose insulating material 702 of strut 701.

In an embodiment, each open region 720*a*–720*c* is formed substantially in a "C" form and encloses a substantially rectangular region 722*a*–722*c*, respectively, of conductive material that is formed integrally with layer 704. In combination, open regions 720*a*–720*c* and regions 722*a*–722*c* attenuate the amount of electromagnetic radiation that is reflected by the ground plane 704 and thereby may be used to attenuate and adjust the sensitivity of the signal detector 700.

In FIG. 7A, FIG. 7B, FIG. 7C, signal detectors 706*a*–706*c* are shown in rectangular configuration and open regions 720*a*–720*c* are shown in "C" shaped configuration, however, other geometries may be used with equal effectiveness and within the scope of the invention.

Signal detector 700 may be held on an engine under test using any appropriate affixing means, such as clips that snugly grasp coils 708*a*–708*c*, clamps, etc. A signal cable may be affixed to signal connection point 716 to route a detected signal to a signal analyzer. Signal detector 700 may be enclosed within a test probe body that interchangeably receives one of a plurality of different signal detectors that are compatible with different engines or cylinder configurations. The lateral separation or alignment of signal detectors 706*a*–706*c* may be adjusted to conform to different engines, coil positions, or cylinder configurations.

Accordingly, a signal detector or test probe has been disclosed. Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A probe for detecting electric ignition signals from a coil on plug of an internal combustion engine, the probe comprising:

a probe housing bearing a first conductive planar layer and a second conductive planar layer separated by and affixed to a non-conductive substrate aid adapted for placement outside of and in close proximity to a coil on plug housing, wherein said second conductive planar layer is a shielding element configured to attenuate a portion of electromagnetic radiation incident to said first conductive planar layer from a coil of said coil on plug when said second conductive planar layer is disposed between said coil on plug housing and said first conductive planar layer.

2. A probe as recited in claim 1, further comprising means for holding the substrate outside of and in close proximity to the coil on plug housing and separated therefrom by a predetermined distance.

3. A probe as recited in claim 2, further comprising:

a signal wire electrically coupled to the first layer and electrically coupled to a signal input of a diagnostic device; and a ground wire electrically coupled to the second layer and electrically coupled to a ground input of the diagnostic device and the ground of the coil on plug.

4. A probe as recited in claim 2, further comprising:

a probe body adapted for interchangeably receiving one of a plurality of substrates.

5. A probe as recited in claim 4, further comprising:

a signal wire electrically coupled to the first layer and electrically coupled to a signal input of a diagnostic device; and a ground wire electrically coupled to the second layer and electrically coupled to a ground input of the diagnostic device and the ground of the coil on plug.

6. A probe as recited in claim 2, wherein said means for holding the substrate in proximity to the coil of the coil on plug is configured to hold the second conductive layer adjacent the coil, and wherein said second conductive layer is a ground layer.

7. A probe as recited in claim 1, wherein the first layer is substantially rectangular, the second layer is substantially rectangular, and the first layer and the second layer have substantially equal surface areas.

8. A probe as recited in claim 1, wherein the first layer is substantially rectangular, the second layer is substantially rectangular, and the first layer and the second layer have substantially different surface areas.

9. A probe as recited in claim 1, wherein the first layer is substantially rectangular, the second layer is substantially rectangular, and a surface area of the first layer is substantially less than a surface area of the second layer.

10. A probe as recited in claim 1, wherein the first layer is substantially rectangular, the second layer is substantially rectangular, and a surface area of the first layer is substantially less than a surface area of the second layer; and wherein a difference in the surface areas of the first layer and the second layer is directly proportional to strength of the electric ignition signals.

11. A diagnostic apparatus for use in analyzing ignition signals generated by a coil on plug, the apparatus comprising:

a signal detector comprising a first conductive planar layer and a second conductive planar layer separated by and affixed to an insulating substrate, said signal detector being disposed within a housing configured for placement outside of and in close proximity to a coil of the coil on plug housing with said second conductive planar layer interposed between said coil on plug housing and said first conductive planar layer;

a signal wire coupled to the first conductive planar layer and coupled to a signal input of a signal analyzer; and a ground wire coupled to the second conductive planar layer and coupled to a ground input of the signal analyzer and the ground of the coil on plug, wherein said second conductive planar layer and said ground wire are configured to attenuate a portion of electromagnetic radiation incident to said first conductive planar layer from said coil.

12. An apparatus as recited in claim 11, further comprising means for holding the signal detector in proximity to the coil of the coil on plug and separated therefrom by a predetermined distance.

13. An apparatus as recited in claim 12, wherein said means for holding the substrate in proximity to the coil of the coil on plug is configured to hold the second conductive layer in close proximity to the coil on plug housing, and wherein said second conductive layer is a ground layer.

14. An apparatus as recited in claim 11, further comprising:

a probe body enclosing the substrate and adapted for interchangeably receiving one of a plurality of substrates;

means on the probe body for holding the probe body in proximity to the coil of the coil on plug and separated therefrom by a predetermined distance.

15. An apparatus as recited in claim 11, wherein the first layer is substantially rectangular, the second layer is substantially rectangular, and the first layer and the second layer have substantially equal surface areas.

16. An apparatus as recited in claim 11, wherein the first layer is substantially rectangular, the second layer is substantially rectangular, and the first layer and the second layer have substantially different surface areas.

17. An apparatus as recited in claim 11, wherein the first layer is substantially rectangular, the second layer is substantially rectangular, and a surface area of the first layer is substantially less than a surface area of the second layer.

18. An apparatus as recited in claim 11, wherein the first layer is substantially rectangular, the second layer is substantially rectangular, and a surface area of the first layer is substantially less than a surface area of the second conductive foil layer; and wherein a difference in the surface areas of the first layer and the second layer is directly proportional to strength of the electric ignition signals.

19. A method of measuring electric ignition signals of a coil on plug of an internal combustion engine, the method comprising the steps of:

holding a signal detector, comprising a first conductive planar layer and a second conductive planar layer which are separated by and affixed to an insulating substrate, outside of and in close proximity to a coil on plug housing with said second conductive planar layer interposed between said coil on plug housing and said first conductive planar layer;

coupling a signal wire from the first layer to a signal input of an electronic signal analyzer;

coupling a ground wire from the second layer to a ground input of the signal analyzer and the ground of the coil on plug;

attenuating a portion of electromagnetic radiation incident to said first conductive planar layer from a coil of said coil on plug using said second conductive planar layer interposed between said coil on plug housing and said first conductive planar layer; and obtaining a measurement of the electric ignition signals using the signal analyzer based on detection of the electric ignition signals by the signal detector.

20. A method as recited in claim 19, wherein the step of holding a signal detector comprises:

holding a signal detector comprising a first conductive layer and a second conductive layer separated by and affixed to an insulating substrate in close proximity to a coil of the coil on plug, wherein the first conductive foil layer and the second conductive foil layer have substantially equal surface areas.

21. A method as recited in claim 19, wherein the step of holding a signal detector comprises:

holding a signal detector comprising a first conductive layer and a second conductive layer separated by and affixed to an insulating substrate in close proximity to a coil of the coil on plug, wherein the first conductive layer and the second conductive layer have substantially different surface areas.

22. A method as recited in claim 19, wherein the step of holding a signal detector comprises:

holding a signal detector comprising a first conductive layer and a second conductive layer separated by and affixed to an insulating substrate in close proximity to a coil of the coil on plug, wherein a surface area of the first conductive layer is substantially less than a surface area of the second conductive layer.

23. A method as recited in claim 19, wherein the step of holding a signal detector comprises:

holding a signal detector comprising a first conductive layer and a second conductive layer separated by and affixed to an insulating substrate in close proximity to a coil of the coil on plug, wherein a surface area of the first conductive layer is substantially less than a surface area of the second conductive layer; and wherein a difference in the surface areas of the first conductive layer and the second conductive layer is proportional to strength of the electric ignition signals.

24. A method as recited in claim 19, further comprising the step of:

adjusting sensitivity of the signal detector by adjusting the relative size of the second layer with respect to the first layer.

25. Apparatus for detecting electric ignition signals from a plurality of coil on plug devices of a multi-cylinder engine, the apparatus comprising:

an insulating substrate that is elongated to span the plurality of coil on plug devices and adapted to be held in close proximity to the plurality of coil on plug devices;

a plurality of signal detectors, each comprising a first conductive planar layer, affixed to a first face of the substrate;

a plurality of second conductive planar layers aligned with the signal detectors and affixed to a second face of the substrate that is opposite the first face and separated from the first layers thereby.

26. An apparatus as recited in claim 25, wherein each of the plurality of second layers comprises a conductive region defined by a surrounding open region in a planar conductive layer that is affixed to the second face.

27. An apparatus as recited in claim 25, wherein the plurality of first layers are conductively coupled by a signal conductor that terminates in a signal connection point.

28. An apparatus as recited in claim 25, wherein the plurality of second layers are defined by open regions in a sheet of copper foil affixed to the second face.

29. An apparatus as recited in claim 25, wherein the plurality of the first layers are formed from copper foil and the plurality of second layers are defined by open regions in a sheet of copper foil affixed to the second face.

30. An apparatus as recited in claim 25, wherein a surface area occupied by at least one of said second conductive planar layers is less than a surface area occupied by a corresponding signal detector.

31. An apparatus as recited in claim 25, wherein a surface area occupied by each of said plurality of second conductive planar layers is less than a surface area occupied by a corresponding one of said plurality of signal detectors.

32. An apparatus for detecting electric ignition signals from a plurality of coil on plug devices of a multi-cylinder engine in accord with claim 25, wherein said second conductive planar layers are configured to attenuate a portion of electromagnetic radiation incident to said first conductive planar layers from said coil on plug devices when said second conductive planar layers are disposed between a housing of said coil on plug devices and said first conductive planar layers.

* * * * *